United States Patent
Sato et al.

(10) Patent No.: US 6,864,482 B2
(45) Date of Patent: Mar. 8, 2005

(54) ELECTRON BEAM APPARATUS

(75) Inventors: Mitsugu Sato, Hitachinaka (JP); Hideo Todokoro, Hinode-machi (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/875,178

(22) Filed: Jun. 25, 2004

(65) Prior Publication Data

US 2004/0227081 A1 Nov. 18, 2004

Related U.S. Application Data

(63) Continuation of application No. 10/111,459, filed on Apr. 25, 2002.

(51) Int. Cl.[7] .............................................. G01N 23/00
(52) U.S. Cl. .................................. 250/310; 306/396 R
(58) Field of Search ............................. 250/306, 307, 250/310, 396 R, 397–400

(56) References Cited

U.S. PATENT DOCUMENTS

| | | | | |
|---|---|---|---|---|
| 4,352,985 A | * | 10/1982 | Martin | 250/306 |
| 4,362,945 A | * | 12/1982 | Riecke | 250/396 R |
| 4,978,855 A | | 12/1990 | Liebi et al. | 250/310 |
| 5,221,844 A | | 6/1993 | Van der Mast et al. | 250/398 |
| 5,300,775 A | | 4/1994 | Van der Mast | 250/305 |
| 6,084,238 A | | 7/2000 | Todokoro et al. | 250/310 |
| 6,614,026 B1 | * | 9/2003 | Adamec | 250/398 |

FOREIGN PATENT DOCUMENTS

| | | | | |
|---|---|---|---|---|
| JP | 2-142045 | 5/1990 | | 250/310 |
| JP | 2-242555 | 9/1990 | | 250/310 |
| JP | 4-328232 | 11/1992 | | 250/398 |
| JP | 6-132002 | 5/1994 | | 250/310 |
| JP | 2821153 | 8/1998 | | 250/310 |

* cited by examiner

Primary Examiner—Frank G. Font
Assistant Examiner—Christopher M. Kalivoda
(74) Attorney, Agent, or Firm—Dickstein Shapiro Morin & Oshinsky LLP

(57) ABSTRACT

An electron beam (4) to be irradiated onto a sample (10) is two-dimensionally scanned by a scanning coil (9), and secondary electrons generated from the sample (10) by the scanning are detected by a secondary electron detector (13). A deflection coil (15) for image shifting is used for electrically deflecting the primary electron beam to shift a field of view for image shift in an arbitrary direction by an arbitrary amount. By the image shift, the primary electron beam (4) to be irradiated onto the sample is energy dispersed to degrade the resolution. However, an E×B field producer (30) for dispersion control gives the primary electron beam energy dispersion in the opposite direction and having the equal magnitude. Therefore, the energy dispersion produced in the primary electron beam by the image shift is automatically corrected.

8 Claims, 7 Drawing Sheets

(a) CROSS SECTION OF BEAM NOT EXPERIENCED DEFLECTING ACTION (b) CROSS SECTION OF BEAM EXPERIENCED DEFLECTING ACTION

ELECTRON BEAM APPARATUS

This application is a continuation of application Ser. No. 10/111,459, filed Apr. 25, 2002, hereby incorporated by reference in its entirety.

TECHNICAL FIELD

The present invention relates to an electron beam apparatus, and particularly to an electron beam apparatus such as a scanning electron microscope for performing evaluation of a micropattern in a semiconductor device or general-purpose observation of a general sample.

BACKGROUND ART

An electron beam apparatus such as a scanning electron microscope obtaining a scanning image of a sample by scanning a primary electron beam on the sample is used for a purpose of pattern evaluation such as inspection or measurement of a micropattern in a semiconductor device. The apparatus of such a kind comprises an image shift function for electrically shifting an electron beam irradiation area (a field of observation view) within a range of several $\mu$m to 10 $\mu$m by electrically deflecting the primary electron beam in order to shift the field of observation view to an evaluation point with high accuracy.

On the other hand, in a scanning electron microscope used for a general-purpose observation of a general sample, a field of observation view is mainly shifted by mechanically shifting a sample stage. However, because the mechanical shifting of the stage becomes difficult when the magnification of observation is high, image shift is used in order to shift a field of observation view to the observation center. In this case, since the field of observation view can be more speedily shifted in a wide range, as the shifting amount of the field of observation view by the image shift is larger, operability of the apparatus can be improved.

Further, in the measurement of semiconductors or high-technology materials, a low acceleration voltage lower than several kV is generally used in order to prevent samples from being charged, and necessity of performing nanometer order observation is increasing. Therefore, in order to improve the resolution under the low acceleration voltage by reducing the aberration of the objective lens, the scanning electron microscope for this purpose is used by shortening the focal distance of the objective lens, or by applying a negative voltage to the sample (retarding method).

In the retarding method of applying a negative voltage to the sample, secondary electrons generated from the sample are accelerated by the voltage applied to the sample to travel to the upper portion of the objective lens. Therefore, as described in the specification of Patent No. 2821153, by producing an electric field and a magnetic field intersecting each other at right angle (an E×B field) in the upper portion of the objective lens, the path of the secondary electrons generated from the sample is deflected to be separated from the path of the primary electrons traveling from an electron source, and thus the secondary electrons are detected by a secondary electron detector in high efficiency. Further, the specification of Patent No.2821153 discloses a method in which in order to eliminate the chromatic aberration produced by the E×B field, another E×B field is provided in the side of the electron source at a position closer to the electron source than the E×B field for deflecting the secondary electron, and the chromatic aberration of the E×B (E-cross-B) field for deflecting the secondary electron is canceled by the chromatic aberration produced by the E×B field provided in the side of the electron source. However, in the technology described in the specification if Patent No.2B21153, the energy dispersion to be corrected is only the energy dispersion produced in the deflection direction (only a single direction) of the secondary electrons.

The image shift function for shifting the field of observation view in an arbitrary direction by an arbitrary amount by electrically deflecting the primary electron beam is a function indispensable to the electron beam apparatus for obtaining a scanning image with high resolution and in high magnification, as described above. However, when image shift is performed, the primary electron beam is energy-dispersed corresponding to the amount of image shift in the shift direction to cause degradation in the resolution. The degradation in the resolution becomes an un-negligible problem as the resolution of the apparatus is increased.

DISCLOSURE OF INVENTION

An object of the present invention is to provide an electron beam apparatus suitable for performing image shift in an arbitrary direction without degrading the resolution.

From a point of view, the present invention is characterized by an electron beam apparatus comprising an electron source for emitting an electron beam; a focusing lens for focusing the electron beam; and a means for producing a scanned image of a sample by scanning the focused electron beam, which further comprises an energy dispersion control means capable of energy-dispersing the electron beam and producing the energy dispersion in an arbitrary direction on a plane intersecting an axis of the electron beam.

From another point of view, the present invention is characterized by an electron beam apparatus comprising an electron source for emitting an electron beam; a focusing lens for focusing the electron beam; and a means for producing a scanned image of a sample by scanning the focused electron beam, which further comprises means for generating an electric field and a magnetic field intersecting each other at right angle on an axis of the electron beam; and a means for controlling strengths of the electric field and the magnetic field so that shift of a deflected direction of the electron beam by the electric field and the magnetic field is set to 180°, and a deflection angle ratio of the electron beam of the electric field to the magnetic field becomes 1 to 2.

The other objects and features of the present invention will appear in the course of the following description referring to the accompanied figures.

BEST MODE FOR CARRYING OUT THE INVENTION

An electron beam emitted from an electron source has deviation in energy due to characteristics of the electron source. For example, an electron beam emitted from an electron source of a Schottky type obtainable of a high bright electron beam has an energy width of 0.4 eV to 0.6 eV. When the electron beam having such energy deviation is electrically deflected, the electron beam reaching a sample is energy dispersed corresponding to the deviation in energy because the amount of deflection depends on the energy of the beam. Since the energy dispersion causes a blur of the electron beam, the resolution is degraded. Before describing concrete embodiments of the present invention, the principle of the degradation of resolution will be described first.

Figure 7:
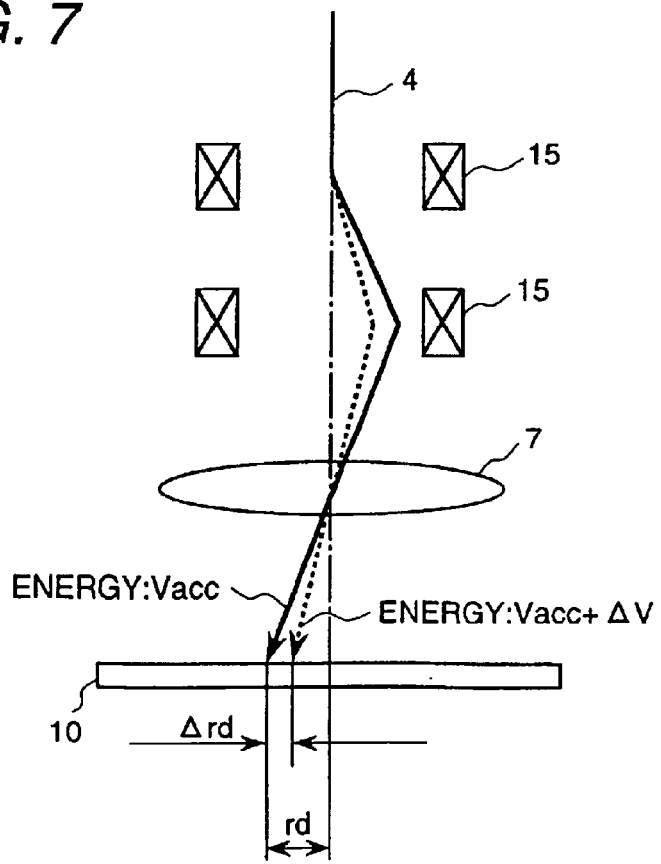
FIG. 7 is a view explaining path-dispersion caused by electrical deflection of a primary electron beam.

Referring to FIG. 7, the primary electron beam 4 is deflected by a magnetic field produced by a deflection coil 15 to be irradiated onto a sample 10 through a center of an objective lens 7. Letting a deflected amount on the sample 10 of the primary electron beam deflected by the deflection coil 15 be $r_d$, the deflected amount $r_d$ can be expressed as follows.

$$R_d = k_d \cdot I_d \cdot V_{acc}^{-1/2} \quad (1)$$

Where, $k_d$ is a deflection sensitivity coefficient determined by shape and number of winding turns of the deflection coil 15, and $I_d$ is a current of the deflection coil 15, and $V_{acc}$ is an acceleration voltage of the electrons passing through the deflection coil 15.

When the primary electrons of the acceleration voltage $V_{acc}$ are received the deflecting action of $r_d$ by the deflection coil 15, the electron beam on the sample 10 receives path dispersion expressed by the following equation by the energy deviation (energy dispersion) $\Delta V$ of the primary electron beam 4 because change in the energy of the electron beam is equivalent to change in the acceleration voltage. That is, $$\Delta r_d = (dr_d/dV_{acc}) \cdot \Delta V = -0.5 \cdot r_d \cdot (\Delta V/V_{acc}) \quad (2)$$

Figure 8:
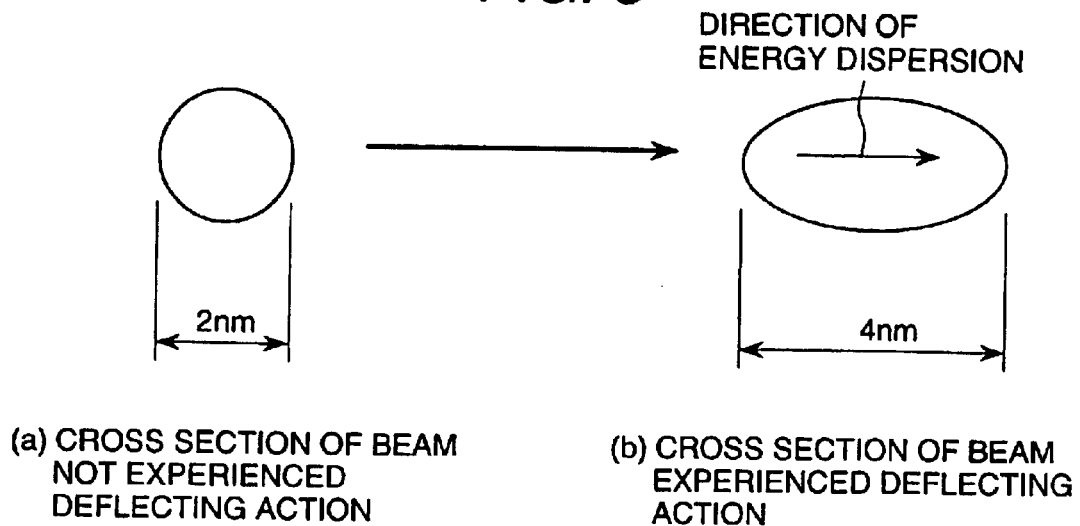
FIG. 8 is a view showing cross-sectional shapes of a primary electron beam before and after experienced energy dispersion.

Since the path dispersion causes blur of the electron beam, the resolution is degraded. For example, providing that the acceleration voltage ($V_{acc}$) is 1 kV, the image shift amount ($r_d$) is 10 μm, and the energy width ($\Delta V$) of the electron beam is 0.4 eV, path dispersion (blur of beam) calculated by Equation (2) becomes 2 nm. That is, when image shift of 10 μm is performed, the path dispersion (blur of beam) of 2 nm occurs in a direction corresponding to the image shift. This means that, for example, in an apparatus capable of obtaining a resolution of 10 μm, shape of the beam is changed from FIG. 8(a) to (b) as shown in the figure by image shift of 10 μm, which means that the resolution is degraded 4 nm in the direction of the path dispersion.

Although a magnetic field type objective lens is generally used for focusing the primary electron beam, an electric field for decelerating the primary electron beam is often produced between the objective lens and a sample in order to further increase the focusing power. This method is known as the retarding method. In such an electron optical system, when the primary electron beam is deflected to be orthogonally incident to the objective lens in order to shift the image, the path dispersion is aggravated by the deceleration electric field between the objective lens and the sample. The degree of the path dispersion by the deceleration electric field between the objective lens and the sample depends on the amount of image shift and the strength of the deceleration electric field.

Figure 9:
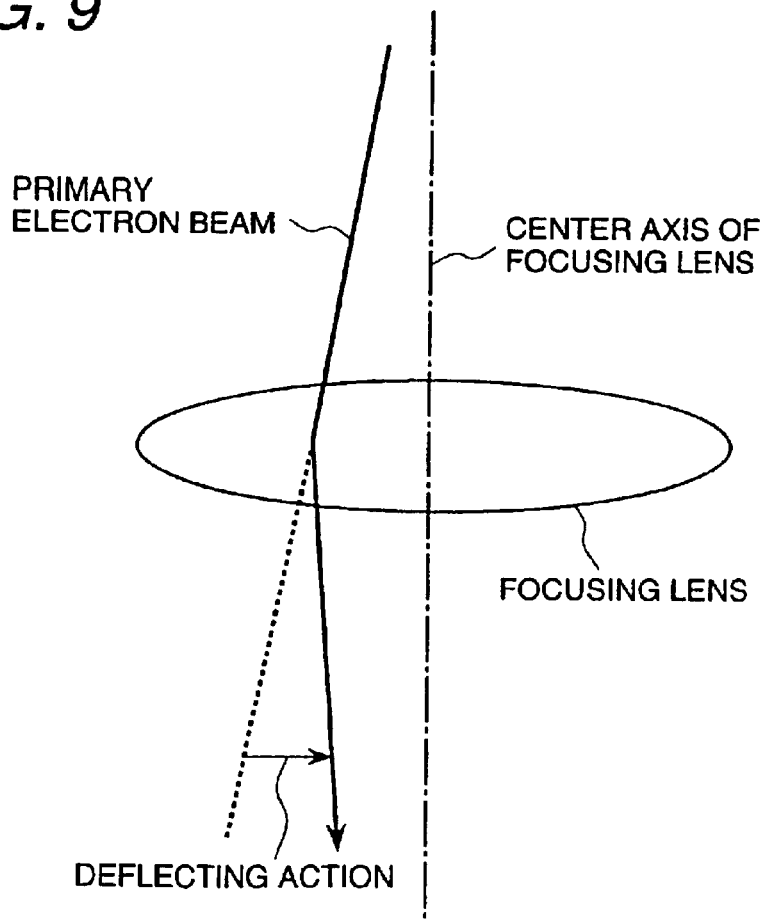
FIG. 9 is a view explaining the principle of producing the path-deflection of the primary electron beam by a focusing lens.

In order to focusing the primary electron beam onto the sample, a plurality of focusing lenses including the objective lens is generally used. In such an electron optical system, when the primary electron beam passes along a path offsetting from the central axis of the focusing lens, in addition to the primary focusing action a deflecting action also appears in the focusing lens, as shown in FIG. 9. By this deflecting action, path dispersion caused by the energy deviation $\Delta V$ of the primary electron beam occurs similarly to the case of the image shift.

Since a conventional electron beam apparatus cannot obtain the resolution equal to or lower than about 2 nm using an acceleration voltage of 1 kV, the energy dispersion caused by the image shift or the offset from the axis of the objective lens has not been recognized. Only the specification of Patent No.2821153 discloses a method of correcting an energy dispersing action in which the strong energy dispersing action produced in an E×B field provided for deflecting the path of accelerated secondary electrons is recognized to be only a factor degrading the resolution. Moreover, the correction method disclosed in the specification of Patent No.2821153 is to correct only the dispersion in a single direction caused by the E×B field for deflecting the secondary electrons, but correction of the above-mentioned energy dispersion two-dimensionally produced in the arbitrary direction is not considered at all. This comes from that the effect of the energy dispersion caused by the image shift and the offset from the axis of the objective lens cannot have been recognized.

The energy dispersion of the primary electron beam can be corrected by producing opposite-direction energy dispersion. However, in the case where the dispersing action occurs two-dimensionally in an arbitrary direction as described above, it is necessary that energy dispersion for correcting the above energy dispersion is produced in an arbitrary direction.

In order to produce the energy dispersion in the primary electron beam, an electric deflecting action should be given to the primary electron beam. At that time, when the deflection action is produced by a magnetic field and an electric field in directions opposite to each other, only energy dispersion caused by deviation of the beam energy can be produced in the primary electron beam without deflecting the path to the primary electrons of the average energy. In order to do so, the electric field and the magnetic field giving the deflecting action to the primary electron beam should be produced so as to intersect each other at right angle. This principle is known as the Wein filter or the E×B (E cross B).

Figure 10:
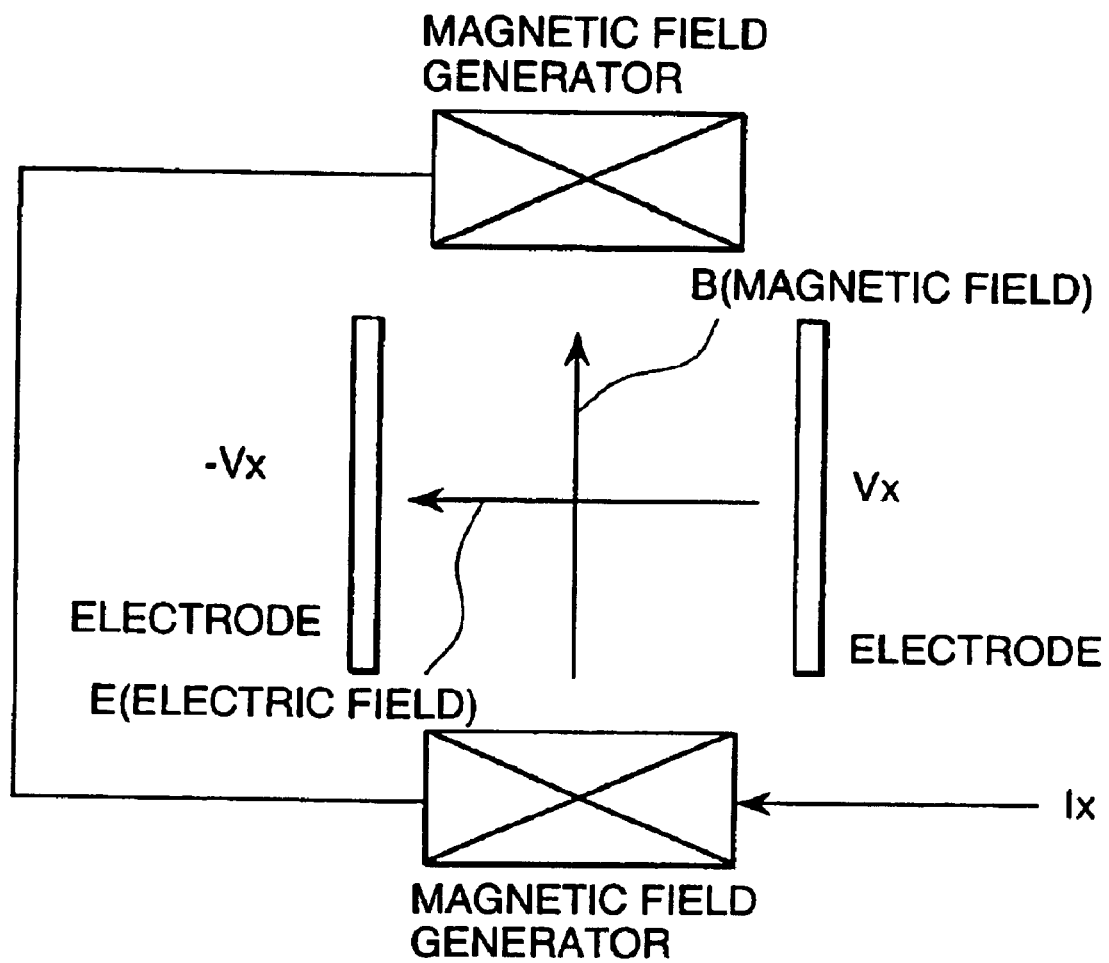
FIG. 10 is a diagram showing the construction of a general E×B field generator.

The E×B is usually used for improving uniformity in energy of the primary electron beam (an energy filter) or for separating electrons having largely different energy or electrons traveling in directions opposite to each other. In this purpose, an E×B composed of a pair of electrodes and a pair of magnetic field generators shown in FIG. 10 is generally used because it is sufficient to produce the deflecting action only in a specified direction. Otherwise, as described in Japanese Patent Application Laid-Open No.6132002, a pair of electrodes and two pairs of coils are arranged to improve the orthogonality between the electric field and the magnetic field.

On the other hand, the energy dispersion of the primary electrons generated by the deflection such as image shift will be produced all the directions corresponding to the moving direction of image shift. Therefore, it is necessary to control the direction and the magnitude of the electric field and the magnetic field corresponding to the motion of the image shift. Accordingly, the means for producing the E×B field for dispersion control is composed of two pairs of electric field generators and two pairs of magnetic field generators arranged orthogonally to each other, as shown in FIG. 2.

Description will be made below on the method of producing the energy dispersion of an arbitrary direction and an arbitrary magnitude in the primary electron beam on the plane crossing (intersecting) the axis of the electron beam at right angle, referring to FIG. 2.

Figure 2:
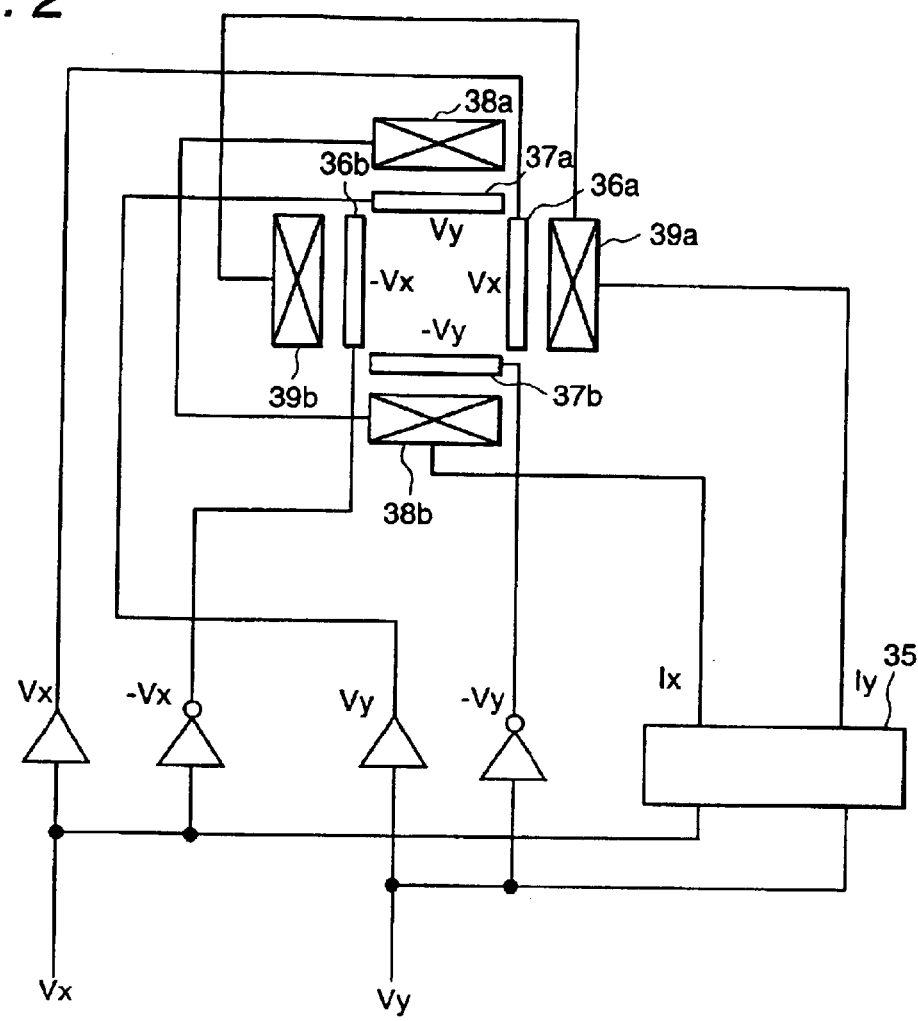
FIG. 2 is a diagram showing the construction of the dispersion control E×B field generator of FIG. 1.

Referring to FIG. 2, the electric field generators and the magnetic generators are arranged so that the reflection fulcrums to the primary electron beam are positioned on a single plane. The electric field generators are composed of a first pair of E×B control electrodes 36a, 36b and a second pair of E×B control electrodes 37a, 37b producing electric fields intersecting each other at right angle, and the first pair of electrodes and the second pair of electrodes are individually arranged opposite to each other. The magnetic field generators are composed of a first pair of E×B control deflection coils 38a, 38b and a second pair of E×B control deflection coils 39a, 39b producing magnetic fields intersecting each other at right angle, and the first pair of coils and the second pair of coils are individually arranged opposite to each other. The electric field produced by the first pair of electrodes intersects the magnetic field produced by the first pair of coils at right angle, and the electric field produced by the second pair of electrodes intersects the magnetic field produced by the second pair of coils at right angle.

In regard to the E×B control voltages Vx, Vy, voltages having different polarities (Vx, −Vx), (Vy, −Vy) are applied to the individual pairs of electrodes (36a, 36b, 37a, 37b), respectively. On the other hand, the control voltages (Vx, Vy) are also supplied to a voltage synthesis circuit 35 to be performed with voltage-current conversion expressed by the following equations, and then supplied to the individual pairs of E×B control coils (38a, 38b, 39a, 39b) as currents Ix, Iy.

$$Ix = (Kxx \cdot Vx + Kxy \cdot Vy) \cdot Vacc^{-1/2} \quad (3)$$

$$Iy = (Kyx \cdot Vx + Kyy \cdot Vy) \cdot Vacc^{-1/2} \quad (4)$$

There, the values Kxx, Kxy, Kyx and Kyy are set so that the deflecting actions of the primary electron beam by the electric fields produced by the voltage Vx and Vy and by the magnetic fields controlled by Equation (3) and Equation (4) are canceled each other, respectively. This setting can be performed, for example, by modulating or ON/OFF operating the control voltage Vx to monitor motion of the primary electron beam on the sample (motion of the scanned image), and adjusting the condition of Kxx and Kxy so as to stop the motion. Otherwise, the E×B control voltage Vx is set to preset different conditions (for example, 0V and 5V), and a means for capturing images obtained from each of the conditions is provided to detect displacement between the captured images, through image processing, and then the optimum condition of Kxx and Kxy can be automatically determined from the displacement through calculation predetermined by an experiment, a simulation or the like. In regard to the voltage Vy, the values Kyx and Kyy can be set the similar adjustment. Once these values are adjusted, the condition of always canceling the deflecting action of the primary electron beam by the E×B field can be held by the acceleration voltage linked control (Vacc$^{-1/2}$) in Equation (3) and Equation (4) even if the acceleration voltage Vacc is varied. Therefore, by controlling the E×B control voltages Vx and Vy, energy dispersion corresponding to the control voltages can be produced in the primary electron beam without giving any deflecting action to the primary electron beam.

As described above, according to the E×B field generator of FIG. 2, the condition of canceling the deflecting action to the primary electron beam (the Wien condition) is satisfied, and at the same time the energy dispersion can be produced in an arbitrary direction. Therefore, by pre-understanding the direction and the magnitude of the energy dispersion received by the primary electron beam focused onto a sample to the direction and the magnitude of image shift, control of the E×B in linking with the image shift can be performed.

In the case where an electric field for decelerating the primary electron beam is produced between the objective lens and the sample to increase the resolution, the magnitude of energy dispersion produced in the primary electron beam also depends on the decoration electric field. Therefore, the control is performed in linking with not only the image shift but also the strength of the deceleration electric field (for example, in linking with the negative voltage applied to the sample). This control can be performed by, pre-investigating the relationship between the strength of the deceleration electric field and the correction amount of the energy dispersion through calculation or an experiment, and then installing the relationship into the control program.

Further, in regard to energy dispersion caused by a factor other than the image shift such as energy dispersion caused by the primary electron beam passing through out of the axis of the focusing lens, it is possible to apply E×B control voltages so as to producing energy dispersion canceling the energy dispersion caused by the factor other than the image shift. However, since the energy dispersion component caused by the offset of the axis of the focusing lens depends on the accuracy of axis adjustment, a means capable of manually adjusting (correcting) the energy dispersion is provided.

Further, the energy dispersion received by the primary electron beam to the intensities of the electric field and the magnetic field composing the E×B varies depending on not only the acceleration voltage but also depending on the operating condition of the electron optical system typical of the focusing distance of the lens. Further, in the construction of electron optical system in which an acceleration electrode for accelerating the primary electrons is arranged the objective lens portion in order to improve the resolution of low acceleration voltage, the magnitude and the direction produced in energy dispersion are varied by the voltage applied to the acceleration electrode. Therefore, it is possible to avoid the energy dispersion of the primary electron beam (degradation of the resolution) to the arbitrary operating condition of the optical system or the arbitrary image shift by pre-understanding the relationship between the control voltage of the E×B and the operating parameters of the electron optical system or the applied voltage of the acceleration electrode of the objective lens through an experiment or simulation to link the control voltage of the E×B the operating parameters of the electron optical system.

In the case where the energy dispersion of the primary electron beam is mainly caused by the image shift, a beam deflection means not producing energy dispersion can be employed. It has been found a method that by employing a means (an E×B field producing means) for producing an electric field and a magnetic field in an arbitrary direction while maintaining to intersect each other at right angle as the means of this type, the ratio of the deflection angle by the magnetic field of the primary electron beam to the deflection angle by the electric field is maintained be two times. According to this method, energy dispersion never produced to an arbitrary beam deflection at all from the following reason.

Deflection angles $\theta E$ and $\theta B$ of electrons of energy Vacc by the electric field E and the magnetic field B can be expressed as follows, respectively.

$$\theta E = KE \cdot VE/Vacc \quad (5)$$

$$\theta B = KB \cdot IB/\sqrt{Vacc} \quad (6)$$

Here, letting the variations (dispersions) of deflection angle of the electron beam by the energy deviation $\Delta V$ be $\Delta\theta E$ and $\Delta\theta B$, respectively, the following equations can be obtained. That is, $$\Delta\theta E = (d\theta E/dVacc) \cdot \Delta V = -(\Delta V/Vacc) \cdot \theta E \quad (7)$$

$$\Delta\theta B = (d\theta B/dVacc) \cdot \Delta v = -0.5(\Delta V/Vacc) \cdot \theta B \quad (8)$$

When the deflection amounts by the electric field and the magnetic field are equal to each other, the magnitude of energy dispersion produced by the electric field is two times as large as that produced by the magnetic field. Therefore, if the intensities of the electric field and the magnetic field of the E×B field are set so that the deflection angle by the magnetic field becomes two times as large as the deflection angle by the electric field and that the deflection directions of the primary electron beam by the electric field and the magnetic field becomes opposite to each other, the energy dispersions by the electric field and the magnetic field are canceled by each other. In other words, letting the amount of deflection of the primary electron beam by the electric field (the value on the sample) be rd, and the amount of deflection of the primary electron beam by the magnetic field be 2rd in the direction opposite to the direction of the deflection by the electric field, energy dispersion associated with the beam deflection is not produced at all, and accordingly the degradation of the resolution does not occur. At that time, the total amount of deflection of the primary electron beam becomes the difference rd between the amounts deflected by the magnetic field and the electric field (because the deflected directions caused by the magnetic field and the electric field are opposite to each other), and accordingly the deflecting means not producing energy dispersion can be materialized. In an image shift function in a common apparatus, when the primary electron beam is deflected using the beam deflecting means arranged above the objective lens, two deflecting means are arranged in two stages along the optical axis and operated so that the aberration of the objective lens produced by the deflection may be minimized. By replacing these two-stage beam deflecting means by the above-mentioned E×B fields each controlled so that the amounts of deflection of the electric field and the magnetic field may become twice, an image shift function not producing the degradation of the resolution caused by the energy dispersion can be realized.

Further, the E×B field controlled so that the amounts of deflection of the electric field and the magnetic field may become twice may be used not only for image shift as a deflector not producing chromatic aberration but also for a deflector for aligning the primary electron beam.

Figure 1:
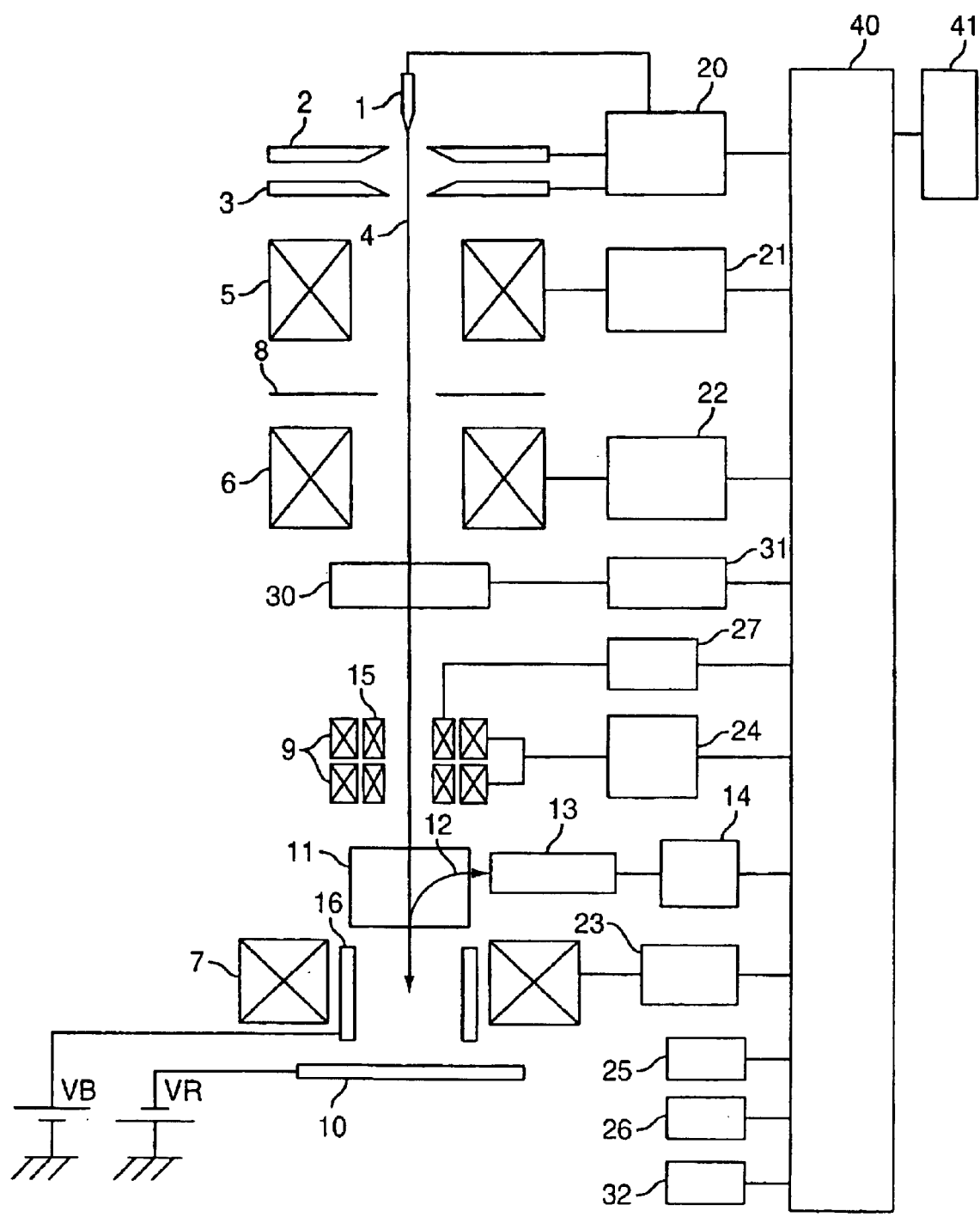
FIG. 1 is a block diagram showing an embodiment of an electron beam apparatus in accordance with the present invention.

A preferred embodiment in accordance with the present invention will be described below. Referring to FIG. 1, a voltage is applied between a cathode 1 and a first anode 2 by a high voltage control power source 20 controlled by a microprocessor (CPU) 40 to extract a primary electron beam 4 in a preset emission current from the cathode 1. Since an accelerating voltage is applied between the cathode 1 and a second anode 3 by the high voltage control power source 20 controlled by the CPU 40, the primary electron beam 4 emitted from the cathode 1 is accelerated and travels to a post lens system. The primary electron beam 4 is focused by a focusing lens 5 controlled by a lens control power source 21, and after removing an unnecessary region of the primary electron beam by an aperture plate 8, the primary electron beam 4 is focused on a sample 10 as a micro-spot by a focusing lens 6 controlled by a lens control power source 22 and an objective lens 7 controlled by an objective lens control power source 23. The objective lens 7 is a kind of focusing lens, and each of the focusing lens 6 and the objective lens 7 is of a magnetic field type in which a focusing lens action is generally produced by conducting exciting current.

The primary electron beam 4 is two-dimensionally scanned on the sample 10 by a scanning coil 9. A secondary signal (a sample signal) 12 such as secondary electrons generated from the sample by irradiating the primary electron beam travels above the objective lens 7, and then is separated from a path of the primary electron beam 4 and deflected toward a secondary signal detector 13 by an orthogonal electric-magnetic field generator 11 for separating the secondary signal. The reflected secondary signal 12 is detected by the secondary signal detector 13. A signal of the secondary signal detector 13 is stored in an image memory 25 as an image signal through a signal amplifier 14. The image information stored in the image memory 25 is displayed on an image display unit 26 at any time. A signal to the scanning coil 9 is controlled by a scanning coil control power source 24 corresponding to an observation magnification ratio. A deflecting coil 15 for image shift is arranged at a position of the scanning coil 9, and is controlled by an image shift control power source 27 corresponding to a necessary shifting amount of field of view.

A negative voltage VR (retarding voltage) is applied to the sample 10 to decelerate the primary electrons at a position just before the sample. Further, a booster electrode 16 for temporarily accelerating the primary electrons is arranged in a portion of the objective lens 7, and a positive voltage is applied to the electrode. The retardant voltage and the booster voltage are controlled by the control CPU 40 to improve the resolution under a low acceleration voltage condition.

A dispersion control E×B field generator 30 capable of giving arbitrary energy dispersion to the focused electron beam on the sample 10 is arranged between the scanning coil and the focusing lens 6, and is controlled by a control power source 31. The dispersion control E×B field generator 30 and the control power source 31 have the construction shown in FIG. 2, and the control voltages Vx and Vy and the coil currents Ix and Iy are controlled by the control CPU 40 so as to satisfy Equation (3) and Equation (4).

A knob 32 on an operating panel is connected to the control CPU 40, and values of the coefficients (Kxx, Kxy, Kyx, Kyy) of Equation (3) and Equation (4) can be input to the control CPU 40 by adjusting the knob 32 at adjusting the dispersion control E×B. At adjusting the dispersion control E×B, signals are given from the control CPU 40 to the control power source 31 so that the control voltages (Vx, Vy) of the dispersion control E×B may be modulated one after the other. Therefore, an operator (an adjuster) can set the optimum values of the coefficients (Kxx, Kxy, Kyx, Kyy) of the dispersion control E×B by adjusting the knob 32 so as to eliminate movement of an image associated with the modulation of the control voltages (Vx, Vy). The adjusting of the coefficients of the dispersion control E×B can be performed by controlling a curser or a scroll bar displayed on a monitor CRT using a mouse pointer instead of using the knob 32.

Figure 3:
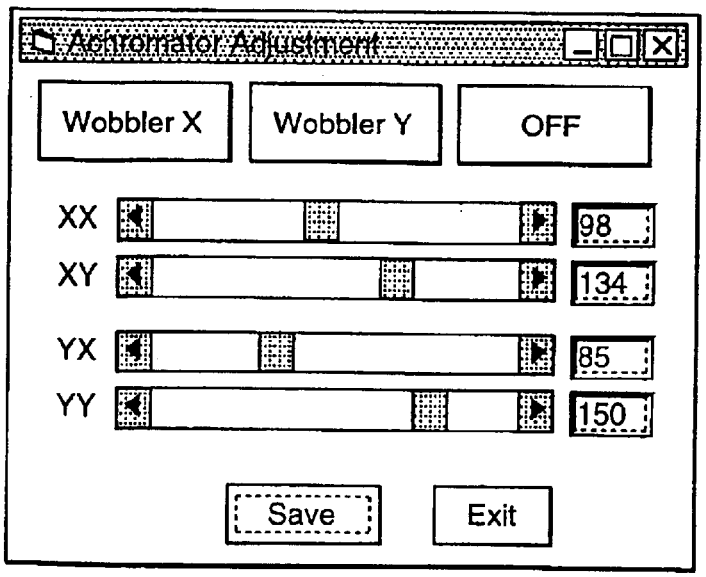
FIG. 3 is a view showing an example of a picture on the image display of FIG. 1.

FIG. 3 is a view showing an example of a picture (an adjustment picture) for adjusting of the coefficients of the dispersion control E×B on the monitor CRT. When the coefficients of the dispersion control E×B are adjusted, the picture of FIG. 3 is displayed, and then the coefficients are set according to the following procedure.

(1) A Wobbler X button in the adjustment picture is clicked using the mouse. At that time, the control CPU 40 controls the control power source 31 so that the control voltage Vx periodically varies.

(2) Since the field of view of the scanned image is moved corresponding to the variation of the control voltage Vx when the values of the coefficients Kxx and Kxy of the dispersion correction E×B are improper, slide bars XX and YY in the adjustment picture are adjusted so that the variation of the field of view is substantially eliminated. Numerical values displayed in the right side of the slide bars express the set coefficients, and numerical values may be directly input into the displayed windows.

(3) A Wobbler Y button in the adjustment picture is clicked using the mouse. By this operation, the control voltage Vy is periodically varied (4) Slide bars YX and YY in the adjustment picture are adjusted so as to stop movement of the scanned image.

(5) The adjusted coefficients (KXX, Kxy, Kyx, Kyy) are stored in the memory of the control CPU by clicking the Save button on the adjustment picture.

(6) After completion of the adjustment, the adjustment picture is closed by clicking the Exit button using the mouse.

If an image processing function for detecting the movement of the image caused by the modulation of the control voltages (Vx, Vy) is provided, it is possible to automatically set the coefficients (Kxx, Kxy, Kyx, Kyy) so as to eliminate the movement of the image.

Figure 4:
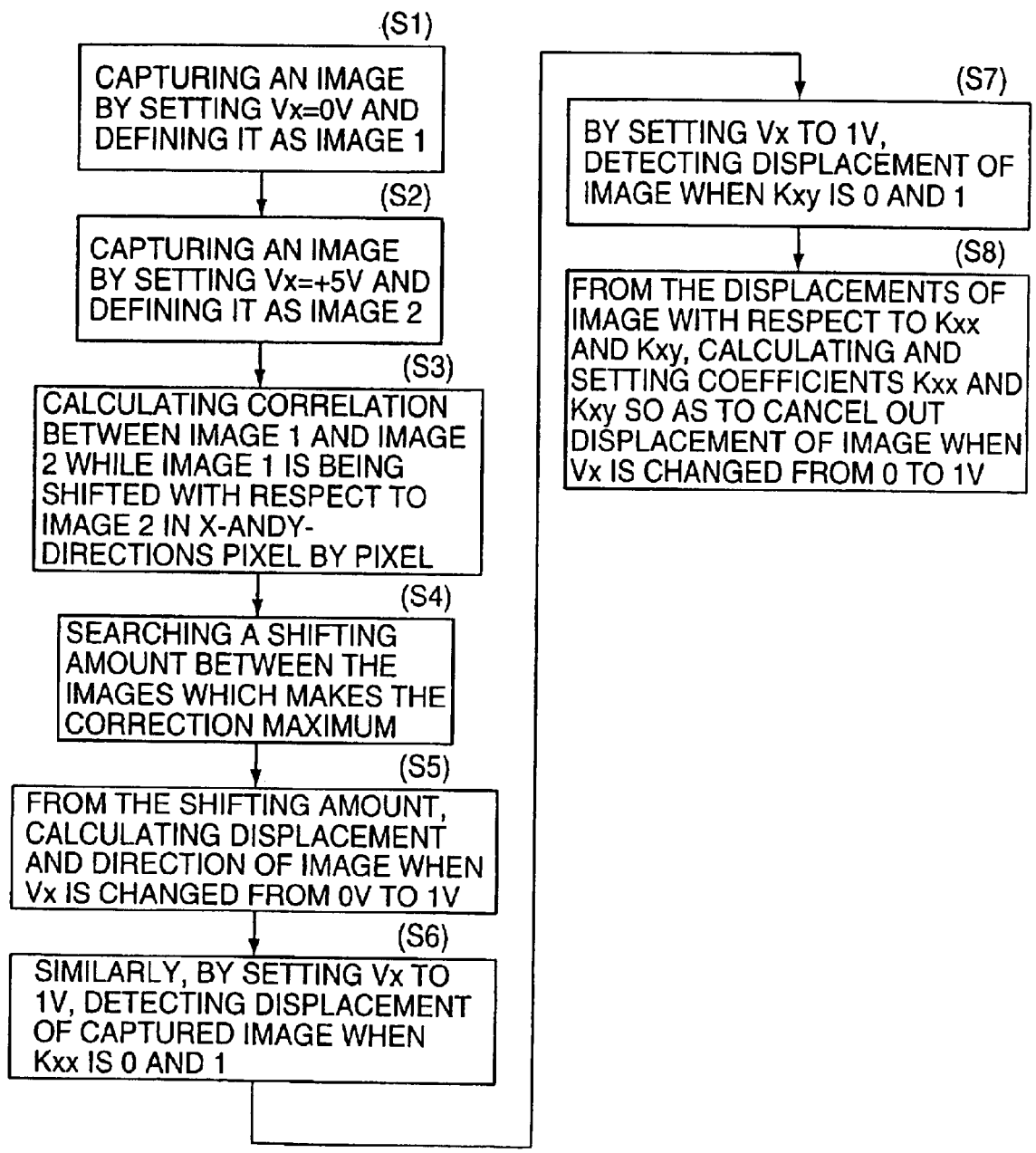
FIG. 4 is a flowchart showing an automatic adjustment flow of the dispersion control E×B field.

FIG. 4 is a flowchart showing a processing flow of automatically executing the above-mentioned adjustment operation by the image processing. In the case of determining the coefficients Kxx and Kxy in regard to the control voltage Vx, images for cases where Vx is 0 V and Vx is +5V are captured (S1, S2). The correlation between the both captured images is calculated while the both captured images are relatively being shifted in the X- and Y-directions pixel by pixel (S3). A shifting amount between the both images making the correlation maximum is searched (S4). The correlation between the both images becomes the maximum when the fields of view of the both images agree and overlap with each other. From the shifting amount of the images when the correlation between the images becomes the maximum, a displacement (a magnitude and a direction) of the field of view to the variation of control voltage Vx (5V) is accurately calculated (S5). Similarly, by capturing images with respect to different values of the coefficients Kxx and Kxy, a displacement amount of the image by each of the coefficients can be quantitatively and automatically calculated (S6, S7). From the result, the coefficients Kxx and Kyy are calculated and set so as to cancel out the displacement of the image by the control voltage Vx (S8). Setting of the coefficients Kyx and Kyy with respect to the control voltage Vy is similarly executed.

Figure 5:
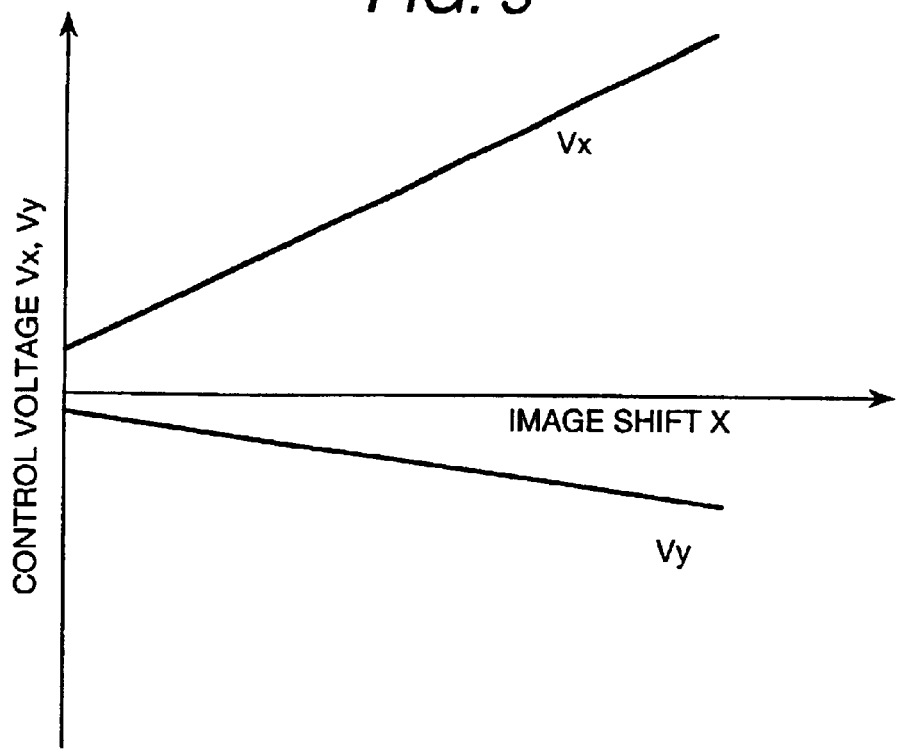
FIG. 5 is a graph showing the relationship between the dispersion control E×B field and the amount of image shift.

FIG. 5 is a graph showing an example expressing the relationship between the control voltages of the dispersion control E×B and the amount of image shift when the image shit is performed in the X-direction. When the image shift is 0, offset values of the control voltages (Vx, Vy) of the dispersion control E×B are set so that the path dispersion caused by factors other than the image shift are canceled. The offset values include corrections of the path dispersion caused by the offset of the axis of the focusing lenses other than the objective lens and of the path dispersion produced in the E×B field for deflecting the secondary electrons. Since the direction of image shift (the X-direction in the example of FIG. 3) does not agree with the direction of the path dispersion or since the direction of the image shift coil (X, Y) does not always agree with the electric field (X, Y) for controlling the dispersion Ayx and Ayy, the both of the voltages Vx and Vy for controlling the dispersion are controlled in linking with each other to the X-direction of image shift. Further, the relationship between the control voltage Vx and Vy and the image shift is controlled under a preset condition in linking with the acceleration voltage and the intensity of the sample and the objective lens (in FIG. 1, the retarding voltage VR and the voltage VB of the booster electrode 16 of the objective lens portion).

In FIG. 5, the values of the control voltages Vx and Vy under the condition of the zero-image shift are controlled in linking with the variation of the focusing point of the primary electron beam by the focusing lens 6.

The correction of energy dispersion produced by the image shift or the other factors is performed by controlling the control parameters Vx and Vy in the E×B field generator 30 as follows.

$$Vx = Axx \cdot Xi + Axy \cdot Yi + Vx_o \quad (9)$$

$$Vy = Ayx \cdot Xi + Ayy \cdot Yi + Vy_o \quad (10)$$

There, Xi and Yi express amounts of control of the image shift (amounts of deflection of the electron beam on the sample). The control coefficients Axx, $Vx_0$, Ayx, Ayy, $Vy_o$ are calculated in advance for each different optical condition such as the acceleration voltage and the deceleration electric field through the procedure of FIG. 6, and stored in an external memory unit 41.

As the optical condition of the apparatus such as the acceleration voltage, the decoration electric field and so on is set, the CPU 40 reads out the corresponding control coefficients (Axx, Axy, $Vx_o$, $Vy_o$) from the external memory unit 41 to execute control in linking with the control of the image shift so that the relationship of Equation (9) and Equation (10) are satisfied.

Figure 6:
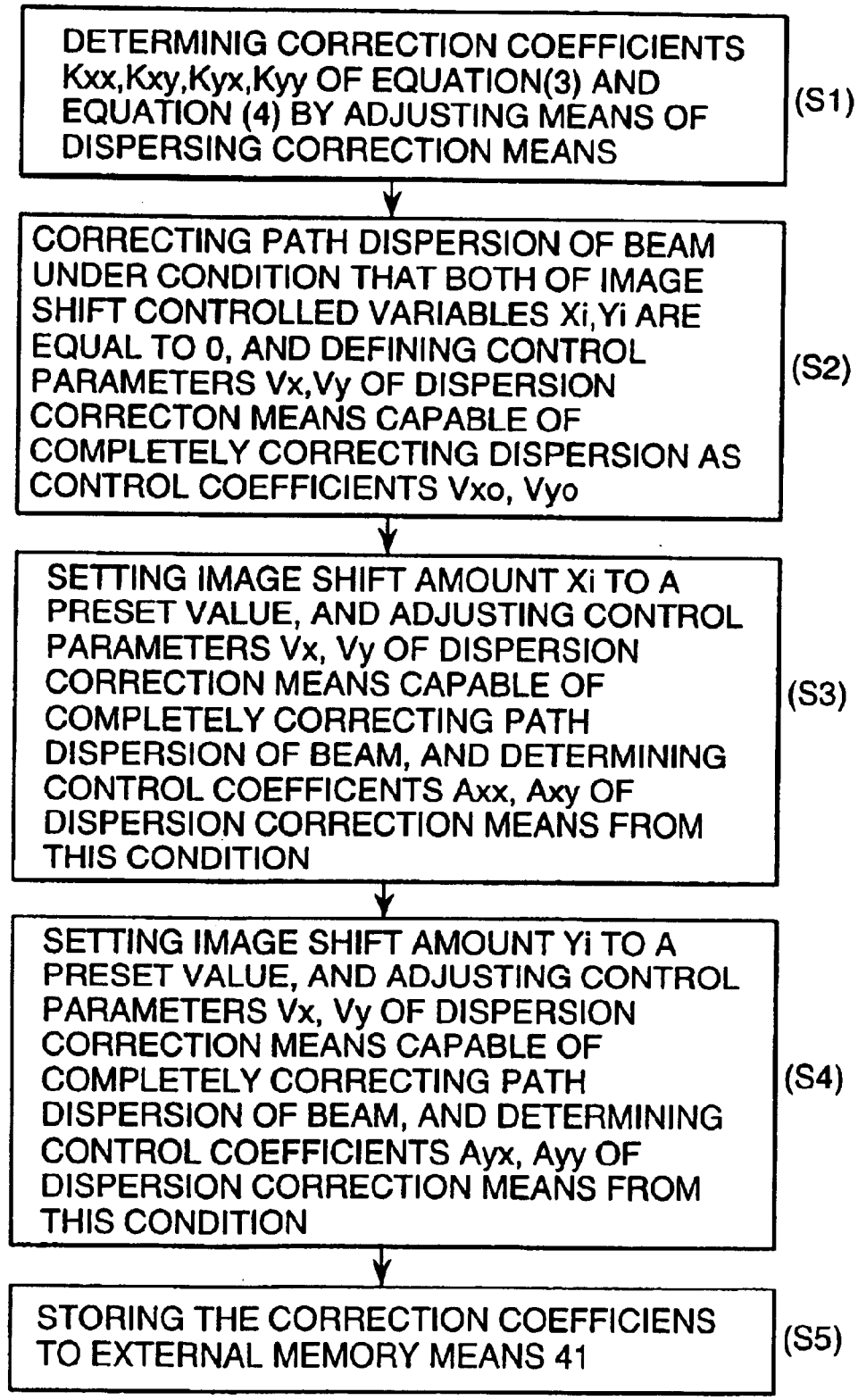
FIG. 6 is a flowchart showing a procedure of determining correction coefficients and control coefficients in the dispersion control E×B field generator.

FIG. 6 shows a procedure of determining the correction coefficients and the control coefficients. The correction coefficients Kxx, Kxy, Kyx and Kyy of Equation (3) and Equation (4) are determined using the adjustment means (the knob 32) of the dispersion correction means (the dispersion control E×B field generator 30) (S1), and the path dispersion of the electron beam is corrected under a condition of setting both of the image shift control amounts Xi and Yi to 0, and then the control parameters Vx and Vy of the dispersion correction means capable of completely correcting the dispersion are defined as the control coefficients $Vx_o$, and $Vy_o$, respectively (S2). Further, by setting the image shift amount Xi to a preset value, the control parameters Vx and Vy of the dispersion correction means capable of completely correcting the path dispersion of the electron beam are adjusted, and the control coefficients Axx and Axy of the dispersion correction means are determined from the condition (S3). Further, by setting the image shift amount Yi to a preset value, the control parameters Vx and Vy of the dispersion correction means capable of completely correcting the path dispersion of the electron beam are adjusted, and the control coefficients Ayx and Ayy of the dispersion correction means are determined from the condition (S4). The correction coefficients and the control coefficients determined through the above-mentioned course are stored in the external memory unit 41.

According to the present embodiment described above, the path dispersion caused by the energy dispersion of the primary electrons produced by the image shift or the other factors can be canceled. Therefore, in an electron beam apparatus capable obtaining high resolution particularly under low acceleration voltage, it is possible to prevent the resolution from being degraded, and to perform the image shift in an arbitrary direction.

As it is obvious that many changes and modifications may be made without departing from the essence of the present invention, it is to be understood that the present invention is not limited to the above-described embodiment.

What is claimed is:

1. An electron beam apparatus comprising an objective lens for focusing an electron beam emitted from an electron source, further comprising:
    a deflector for deflecting said electron beam from an optical axis of said objective lens;
    a Wien filter for dispersing said electron beam so that the aberration of said electron beam, which appears when said electron beam is deflected from said optical axis of said objective lens by said deflector, becomes lessened; and
    a control device for setting a working condition of said Wien filter so that an image displacement, which is caused by irradiation of said electron beam when said working condition of said Wien filter is varied, is reduced.

2. An electron beam apparatus according to claim 1, wherein said Wein filter comprises an electric field generator having two pairs of electrodes and a magnetic field generator.

3. An electron beam apparatus according to claim 2, wherein said control device impresses a periodically altering control voltage on each of said two pairs of electrodes to vary said working condition of said Wien filter.

4. An electron beam apparatus according to claim 2, wherein said control device imports images for every impression of different control voltages on said electric field generator to correlate said imported images, shifting one image relatively from another image, and computes an amount of positional shift between said imported images in terms of said altered control voltages based on a shifting degree that shows a close correlation.

5. An electron beam apparatus according to claim 4, wherein said electric field generator has two pairs of electrodes; and
    said control device controls voltages across pair-electrodes in said two pairs of electrodes to eliminate displacement of an image caused from variation in the voltage across said pair-electrodes in either of said two pairs of electrodes.

6. An electron beam apparatus comprising an objective lens for focusing an electron beam emitted from an electron source, further comprising:
    a deflector for deflecting said electron beam from an optical axis of said objective lens;
    a Wien filter for dispersing said electron beam so that an aberration of said electron beam, which appears when said electron beam is deflected from said optical axis of said objective lens by said deflector, becomes lessened; and
    a control device for varying a dispersing condition of said Wien filter according to an acceleration voltage of said electron beam.

7. An electron beam apparatus according to claim 6, wherein said control device forms a decelerating electric field between said objective lens and a specimen to which said electron beam is irradiated and varies said dispersing condition of said Wien filter according to a variation in said decelerating electric field.

8. An electron beam apparatus comprising an objective lens for focusing an electron beam emitted from an electron source and an acceleration electrode for accelerating said electron beam, further comprising:
    a deflector for deflecting said electron beam from an optical axis of said objective lens;
    a Wien filter for dispersing said electron beam so that an aberration of said electron beam, which appears when said electron beam is deflected from said optical axis of said objective lens by said deflector, becomes lessened; and
    a control device for varying a dispersing condition of said Wien filter according to a voltage impressed on said acceleration electrode.

* * * * *